(12) United States Patent
Sorensen

(10) Patent No.: US 10,414,357 B1
(45) Date of Patent: Sep. 17, 2019

(54) SYSTEM TO SELECTIVELY PROVIDE POWER TO RECREATIONAL VEHICLES WITH A SAAS APPLICATION ACCESSED VIA MOBILE DEVICES

(71) Applicant: Wild Energy, Inc., Wheaton, IL (US)

(72) Inventor: Michael Sorensen, Wheaton, IL (US)

(73) Assignee: Wild Energy, Inc., Wheaton, IL (US)

( * ) Notice: Subject to any disclaimer, the term of this patent is extended or adjusted under 35 U.S.C. 154(b) by 0 days.

(21) Appl. No.: 16/446,306

(22) Filed: Jun. 19, 2019

Related U.S. Application Data

(60) Provisional application No. 62/856,711, filed on Jun. 3, 2019.

(51) Int. Cl.
| | |
|---|---|
| *G06F 19/00* | (2018.01) |
| *B60R 16/023* | (2006.01) |
| *H04W 4/35* | (2018.01) |
| *G05B 19/042* | (2006.01) |
| *H02J 13/00* | (2006.01) |
| *B60R 16/03* | (2006.01) |
| *B60P 3/32* | (2006.01) |

(Continued)

(52) U.S. Cl.
CPC .......... *B60R 16/0238* (2013.01); *B60R 16/03* (2013.01); *G05B 19/042* (2013.01); *H02J 13/00* (2013.01); *H04W 4/35* (2018.02); *B60P 3/32* (2013.01); *G05B 2219/2639* (2013.01); *H04L 67/306* (2013.01); *H04W 88/18* (2013.01)

(58) Field of Classification Search
CPC ...... B60R 16/0238; B60R 16/03; H02J 13/00; G05B 19/042; G05B 2219/2639; H04W 4/35; H04W 88/18; H04L 67/306; B60P 3/32
See application file for complete search history.

(56) References Cited

U.S. PATENT DOCUMENTS

| | | | |
|---|---|---|---|
| 9,321,361 B2 * | 4/2016 | Kamen | B60L 8/003 |
| 2003/0105567 A1* | 6/2003 | Koenig | H01M 10/48 |
| | | | 701/36 |
| 2005/0141154 A1 | 6/2005 | Consadori et al. | |

(Continued)

OTHER PUBLICATIONS

"RV Electrical: All the Basics You Need to Know!" printed from http://rvshare.com/blog/rv-electrical (Year: 2019).*

(Continued)

*Primary Examiner* — Michael D Masinick
(74) *Attorney, Agent, or Firm* — Pillsbury Winthrop Shaw Pittman LLP

(57) ABSTRACT

Provided is a system, comprising: an electrical power meter comprising: a network interface; electrical power inputs configured to receive electrical power from a power-distribution system of a vehicle facility configured to host a plurality of vehicles; first and second electrically controlled switches coupled to vehicle power connectors; and a client-side processor configured to communicate with a remote server system; and the remote server system, configured to: cause a user-computing device of a user to display a user interface by which power-delivery is configurable; receive a request to deliver electrical power via a vehicle power connector; and in response, transmitting, to the electrical power meter, a command that causes the client-side processor to adjust the electrically controlled switch.

21 Claims, 4 Drawing Sheets

(51) Int. Cl.
  *H04W 88/18* (2009.01)
  *H04L 29/08* (2006.01)

(56) References Cited

U.S. PATENT DOCUMENTS

| | | | |
|---|---|---|---|
| 2011/0025267 A1* | 2/2011 | Kamen | B60L 8/003 |
| | | | 320/109 |
| 2012/0181982 A1 | 7/2012 | Fecher | |
| 2014/0180914 A1* | 6/2014 | Abhyanker | G01C 1/00 |
| | | | 705/39 |
| 2014/0300182 A1 | 10/2014 | James | |
| 2014/0354402 A1 | 12/2014 | Joao | |
| 2015/0046200 A1* | 2/2015 | Chihara | G06Q 10/02 |
| | | | 705/5 |
| 2016/0003621 A1* | 1/2016 | Koenig | G01C 21/00 |
| | | | 701/31.4 |
| 2017/0123469 A1 | 5/2017 | Bhogal et al. | |
| 2019/0019407 A1* | 1/2019 | Nakhjavani | G08G 1/0137 |
| 2019/0054872 A1 | 2/2019 | Ganiere | |
| 2019/0109489 A1 | 4/2019 | Miller | |
| 2019/0128967 A1 | 5/2019 | Cheng et al. | |

OTHER PUBLICATIONS charge Point, "Get the ChargePoint App," https://www.chargepoint.com/drivers/mobile/, 2019, pp. 1 to 3.

EVgo, "Fast Charging is a Swipe Away: Download the EVgo App to start charging on the nation's largest fast charging network," https://www.evgo.com/download-app/, 2019, pp. 1 to 2.

Web Archive of Greenlots, "EV Drivers," https://greenlots.com/ev-drivers/, May 16, 2019, pp. 1 to 7.

ITunes App Store, "SemaConnect," https://apps.apple.com/us/app/semaconnect/id471861561, 2019, pp. 1 to 3.

* cited by examiner

SYSTEM TO SELECTIVELY PROVIDE POWER TO RECREATIONAL VEHICLES WITH A SAAS APPLICATION ACCESSED VIA MOBILE DEVICES

CROSS-REFERENCE TO RELATED APPLICATIONS

The present application claims the benefit of U.S. Provisional Patent Application 62/856,711, titled SYSTEM TO SELECTIVELY PROVIDE POWER TO RECREATIONAL VEHICLES WITH A SAAS APPLICATION ACCESSED VIA MOBILE DEVICES, filed 3 Jun. 2019. The entire content of each afore-mentioned patent filing is hereby incorporated by reference.

BACKGROUND

1. Field

The present disclosure relates generally to electrical power management and, more specifically, to a system to provide metering and control of electrical power to vehicles (e.g., recreational vehicles at RV parks, trucks at truck stops, boats in marinas) with a SaaS application accessed via mobile devices.

2. Description of the Related Art

Power distribution systems for mobile, temporary, and heterogeneous loads are used in a variety of scenarios. Examples include camping facilities, like recreational vehicle (RV) parks or campgrounds. In these use cases, often a facility includes a number of geographically distributed sites, like camping spots, boat docking spots, or RV parking spots, and each of the sites has an interface for a visitor-provided load to draw electrical power at that site. Various types of loads are often supported, ranging from smaller loads like campsite lighting to larger loads like motorhomes or fifth wheels with air conditioning, heating, and other electrical power consuming devices typically associated with residential buildings. Similar existing power distribution systems are used in marinas.

SUMMARY

The following is a non-exhaustive listing of some aspects of the present techniques. These and other aspects are described in the following disclosure.

Some aspects provide a system, including: a first electrical power meter configured to selectively provide electrical power at a first current amount via a first vehicle power connector and provide electrical power at a second current amount via a second vehicle power connector, the first electrical power meter comprising: a first network interface; one or more electrical power inputs configured to receive electrical power from a power-distribution system of a vehicle facility configured to host a plurality of vehicles; a first electrically controlled switch configured to selectively conduct electrical power from the power-distribution system via the first vehicle power connector; a second electrically controlled switch configured to selectively conduct electrical power from the power-distribution system via the second vehicle power connector; and a first client-side processor coupled to the first network interface, the first electrically controlled switch, and the second electrically controlled switch, wherein the first client-side processor is configured to communicate via the first network interface with a remote server system; and the remote server system, comprising: one or more server-side processors; and memory storing instructions that when executed effectuate operations comprising: causing a user-computing device of a user to display a user interface by which power-delivery via the first electrical power meter is configurable; receiving, from the user-computing device, a request to deliver electrical power via the first vehicle power connector; and in response to receiving the request, transmitting, to the network interface of the first electrical power meter, a command that causes the client-side processor to adjust the first electrically controlled switch to effectuate delivery of electrical power at the first current amount via the first vehicle power connector.

Some aspects include a tangible, non-transitory, machine-readable medium storing instructions that when executed by a data processing apparatus cause the data processing apparatus to perform operations including those mentioned above.

Some aspects include a process of performing operations including those mentioned above.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
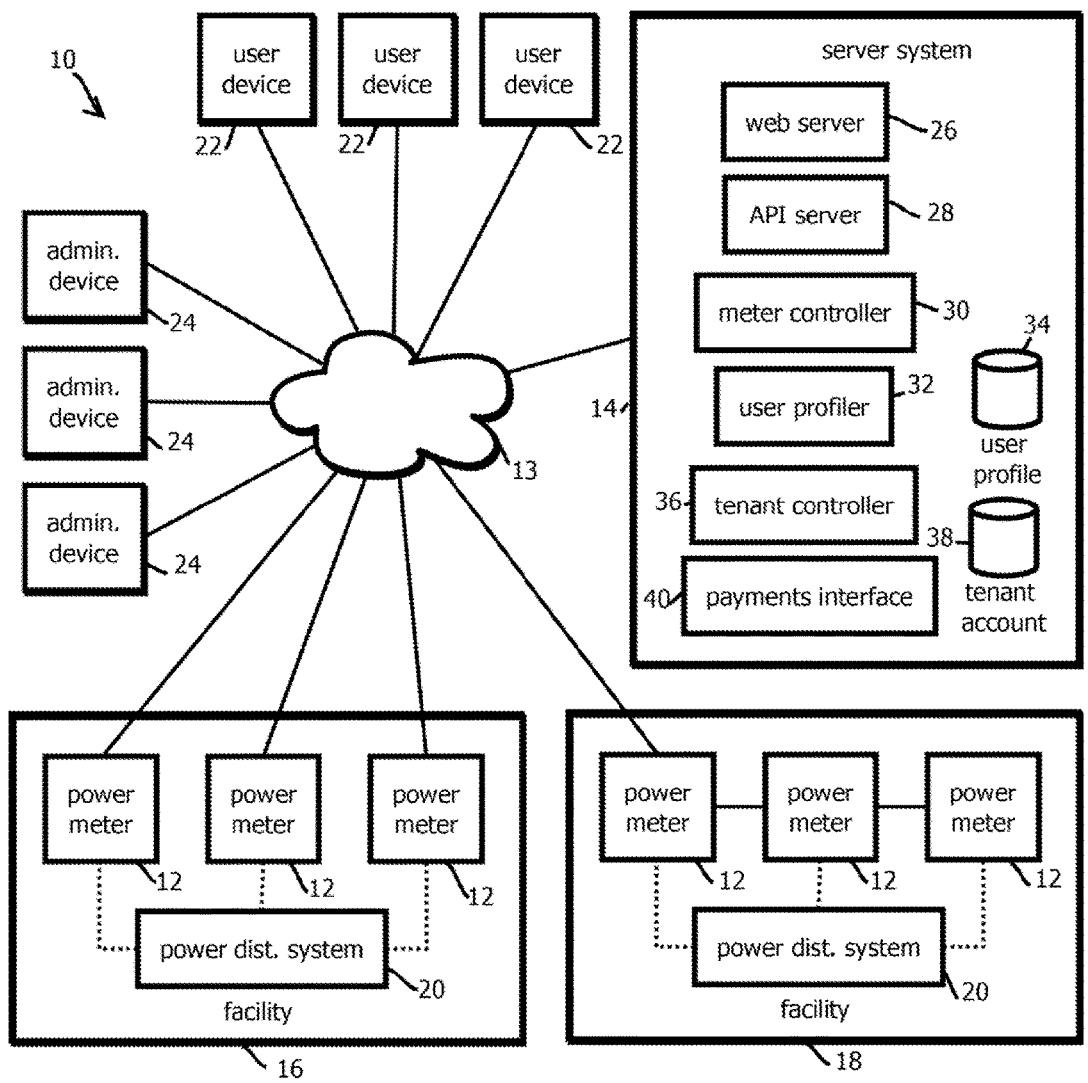
FIG. 1 is a block diagram showing an example of a computing environment and collection of power distribution systems in accordance with some embodiments of the present techniques.

While the present techniques are susceptible to various modifications and alternative forms, specific embodiments thereof are shown by way of example in the drawings and will herein be described in detail. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of electrical engineering. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Currently when a person wants to stay overnight in a campground, they often must reserve a spot with in the park and in many cases specify the type of camping equipment they will be using. Campers may have a tent, small camping trailer (e.g. pop-up camper), small motor home, larger motorhome (Class C), larger camping trailer (fifth wheel), a very large Class A motorhome (like a bus), etc. In most cases the camper will want access to power in order to charge their electronics, lighting, cooking, refrigeration, air conditioning, etc.

Camp ground owners try to provide the amenity of "power" by providing electrical power posts at many of the camping locations within their park. Typical posts have a number of different outlets with different connection types and amounts of power for the equipment being connected. These "dumb" power boxes often allow anyone present to connect to any of the power ports from the 20-amp, 30-amp, 50 amp, or other. Camp ground owners are often unable to measure or charge for the different power consumption between a tent user and a bus user who is using 100 times more energy.

Some camp grounds which offer long term tenancy will install "metered" posts which are similar to residential power meters. These metered posts often require expensive construction projects, are often not suitable for retrofits, and often require manual intervention to read and configure.

Some embodiments include a micro controller and electronic relay control device that can be installed inside the standard dumb electrical panels making them "smart" and able to be controlled. This Internet of Things (IoT) device may be remotely controlled by the end user's computing device (e.g., a Camper's mobile phone) to select the type and duration of the power the Camper desires to consume.

Some embodiments include two electronic boards like those depicted in U.S. Provisional Patent Application 62/856,711 incorporated by reference above. The first is a controller board. This exemplary board may contain all of the programming, micro-processor, communications technology, and connectors for an antenna, controlling the LEDs, and an over-ride key-switch. Some embodiments also include a temperature sensor. In some embodiments, this board connects to a daughter board (second board) via interface pins or connectors to control the attached board. In some cases, the controller board is stacked relative to the daughter board and held parallel, in spaced relation to reduce the size of the installation to fit within legacy power boxes.

The controller board may be configured control many different types of boards with different configurations. These include a special board for campgrounds, a Recreational Vehicle (RV) board, which can control the three different types of campground connectors (20-amp, 30 amp, and 50 or 60 amp). Some embodiments also have an Electric Vehicle (EV) board, which can control two 50- or 60-amp circuits individually. Some embodiments also have special boards for storage facilities (where RV and campers are stored), as well as Marine connectors for powering boats within a marina.

In some embodiments, the example RV board may be attached to and connected with the controller. The RV board may be configured to handle a plurality of (e.g., all of) the AC circuits of the power box and includes relays for turning them on and off as well as current sensors to measure how much power is being used by each of the circuits. This board also serves as the power source for some embodiments by taking AC power from the power box and converting it to DC voltage uses by the controller board.

Some embodiments further include several external (relative to the boards) components, including:
  a. Antenna—an antenna is for communicating wirelessly between the power box and the internet and our computer applications (servers, mobile phones, and management tools).
  b. Light Emitting Diodes (LEDs), which may be mounted on the exterior of the power box. These LEDs (or other displays) may provide the end user with status information about how the power box and controller board are functioning.
  c. Key Switch—This key switch may be used to override the function of the invention and to put it in manual mode. Using this key switch, an authorized user (e.g., with a key suitable to unlock a physical lock by which the boards are accessed within a metal container) may turn on all of the circuits of the box and disable the remote management of the device. This may be useful when the device is malfunctioning, the wireless services are unavailable, or when facility operations wish to provide the end user with electricity immediately.

The system may include the boards (which may be installed in, on, adjacent, or in communication with, the power boxes), as well as servers hosting a web-based application and servicing a native mobile application.

The computer systems may keep track of all of the power-box devices, check their status, record their state, record their temperature, record the energy users, and can issue commands to trigger actions on the device.

The web-based interface may allow the operator of the system and the park owner to see the full inventory and status of the devices, filter them by location, owner, and status, and issue remote commands to trigger actions on the devices.

The mobile application may be used by the end user (camper, boat owner, or person storing a recreational vehicle) after installation on their mobile device. The mobile application may allow the end user to select which power box they would like to control, select the services desired, and pay for the use of those services.

The present techniques are expected to address various needs in the field:
  a. Generally, there are no existing "smart" meters or smart (e.g., controllable) power boxes for the recreational vehicle market (marine or land).
  b. Generally, there are no existing self-service power options for the recreational vehicle market.
  c. In some embodiments, the design of the electronics makes the system modular and adaptable to multiple different configurations, e.g., by swapping the AC board, technicians can control power for an RV application, an EV application, and other applications.
  d. Generally, there are no existing solutions that can be retro-fit into existing power boxes.
  e. Some embodiments implement a key switch override, which is not found on other solutions for the EV market.
  f. Generally, there are no existing solutions that let consumers purchase power in different quantities (e.g. 20 amp & 30; or 50/30, etc.). Currently, typically, when a consumer purchases power for an EV, they get one circuit with one output rating.
  g. Some embodiments allow for the purchase of power and can be combined with the purchase of other services such as the parking spot, slip rental, or campground spot rental. In other words, when the consumer attempts to initiate the purchase of power, they may be required to rent the location at the same time. For example, state transportation department roadside facilities may have rest areas where campers can purchase an overnight parking spot and can also purchase power. Some embodiments may allow them to make this a single transaction (self-service) and charge for both the spot and the power.

The above use cases can present particular challenges when leveraging modern computing technology. Often, the facilities were built a relatively long time ago, using lagging technology, and it can be expensive or complex to retrofit to add additional functionality. Further, because the sites with power are often numerous and geographically distributed throughout a facility, in many cases exposed to the elements, it can be difficult to modify the systems. These issues are aggravated by the distributed, often outdoor, and often older infrastructure in many facilities, which in many cases does not include networking equipment that would be helpful when mitigating these issues.

Further, many existing approaches suffer from issues related to variability in a user population. In many cases, legacy systems place the operator of such facilities at the mercy of their user base, in some cases with some users drawing excessive amounts of power, without the operator of the facility having a way to measure and detect anomalous users or intervene in excessive power consumption scenarios to protect their power distribution system.

Some embodiments may mitigate some of the above-describe problems or other problems discussed below or that will be self-evident to one of ordinary skill in the art given the benefit of the present disclosure. Some embodiments may include smart power meters at each of the above-described sites that interface with a computing system by which facility users can configure and purchase site-specific electrical power delivery and facility operators can monitor and reconfigure electrical power delivery on a site-by-site basis. In some embodiments, the smart meters may be configured to address unique challenges presented by facilities like campgrounds, truck stops, and recreational vehicle parks. Some embodiments may be configured to retrofit a legacy power distribution system in such an environment, in some cases providing independent monitoring and controls of different types of electrical power, like different current delivery amounts via different physical electrical plug interfaces at each site. Some embodiments may further include wireless interfaces by which the smart meter communicates with a remote server system, for instance, via cellular networks and the Internet, and that remote server system may expose a set of APIs by which native applications and webpages interrogate data of the system, present dashboards, and purchase and configure and monitor delivery of electrical power on a site-by-site and in some cases, amperage-by-amperage or receptacle-by-receptacle basis for a plurality of sites at a plurality of facilities.

Some embodiments may leverage this added infrastructure to layer on additional services provided in such facilities, for example, by providing wireless network access to site users for accessing content via the Internet, streaming content to site users, providing security monitoring at sites, applying similar types of purchase models with metering and controls to delivery of water, providing emergency services, providing security services, and the like. Further, these techniques may be deployed in other use cases, including in off-grid residential power networks relying on solar power, car charging networks, battery charging stations and airports, and the like.

FIG. 1 is a block diagram depicting a computing environment 10 in which the above-described techniques may be implemented in some embodiments. The computing environment 10 may include a plurality of power meters 12 in communication with the server system 14 via the Internet 13 and various other networks, like cellular networks (e.g., 4G or 5G networks), low-Earth orbit satellite networks, and local area networks. The power meters 12 may be in groups corresponding to different facilities 16 and 18 at which the power meters 12 are physically located, and the power meters 12 may interface between loads at the facility and power distribution systems 20 at the different respective facilities. In some embodiments, various user devices, like mobile phones or other computing devices having a web browser or native application installed thereon may interface with the server system 14 to purchase, configure, and monitor various services, like power delivery, described above via the power meters 12 that are physically co-located at sites at the facility 16 and 18. Similarly, admin computing devices 24 may be operated by staff of the facilities 16 and 18 to monitor, configure, and control delivery of these various services, in some cases by presenting dashboards or other reports or alerts based upon aggregate (e.g., mean, median, mode, total, max, min, etc.) behavior of the facility and detected outliers at the facility 16 or 18. Some embodiments may operate the server system 14 with a software as a service model in which different tenants have different collections of facilities 16 or 18 at which there staff and various users with various roles and permissions may have the ability to perform the described actions.

Commercially relevant scales are expected to be larger than that depicted. In some embodiments, various components of the computing environment 10 may be geographically distributed, for example, over more than 10 km², like over more than 10,000 km², for instance over more than one US state, like across the continental United States or the world. Three power meters 12 are shown in each facility 16 and 18, but commercial embodiments are expected to include substantially more, for instance, more than 10, more than 100, and in some cases more than 1000 power meters at each facility 16 or 18. In some embodiments, there may be substantially more facilities, for example, more than 10, more than 100, or more than 1000 different facilities, in some cases associated with more than 2, more than 10, or more than 1000 different tenant accounts, each tenant account having one or more of the facilities associated therewith by the server system 14, and tenant profiles described below. Similarly, only three admin devices 24 and three user devices 22 are shown, but commercial embodiments are expected to support substantially more concurrent sessions, like more than 10, more than 100, or more than 1000 concurrent sessions in which different aspects of the above-services are being monitored or controlled or otherwise configured.

In some embodiments, each power meter 12 may be implemented with the example of a retrofit described below with reference to FIG. 2 or a new install having the functionality of the system described below with reference to FIG. 2, for example, using the described components. In some embodiments, the computing ecosystem 10 may execute the process described below with reference to FIG. 3, in some cases, with computing devices like that described below with reference to FIG. 4 operating in each of the described distinct computing devices, and in some cases as a controller of the power meters 12.

In some embodiments, the facilities 16 and 18 may include a plurality of sites, like more than 10, more than 100, or more than 1000. In some embodiments, each site may include an electrical interface to the power distribution system, an interface to a water distribution system or water drainage system, and various other amenities, like tables, parking spots, fire pits, and the like. In some embodiments, the sites may not have wired network access, and in some cases the sites may not have wireless network access from a local area network of the facility absent the hardware described herein with reference to the power meters 12 in the form of the below-describe retrofit kits. In some embodiments, the facilities 16 and 18 may be in remote, rural areas without wired Internet access anywhere at the facility. In some embodiments, facilities may have their own power-generation system coupled to the power distribution system 20, for instance in the form of photovoltaic cells and associated batteries, diesel generators, hydroelectric generators, and the like, which in some cases may be decoupled from the power grid used by the general public elsewhere.

In some embodiments, the power distribution systems 20 include transformers to convert higher voltage electrical power distributed more broadly to a voltage and current suitable for the power distribution system 20. In some embodiments, the systems 20 may further include fuses configured to cease providing electrical power in the event of an excessive amount of current draw to protect the system. The power distribution systems 20 may include conduit in which electrical wires are run over a facility, in some cases ramified throughout the facility via underground routing (which can also make it expensive to retrofit legacy installs via wired network connections that are not currently present). Or in some cases, some of the wiring by which electrical power is delivered to the various sites may be overhead through portions or all of the facility.

In some embodiments, the power distribution system 20 may terminate in an electrical box at each site, like a metal pillar through which the electrical wiring of the system 20 is routed up to a head with various receptacles complying with various standards by which different amperage is of electrical power may be delivered. In some embodiments, the pillars of each site may include electrical plugs or other interfaces configured to deliver electrical power at various amperages and voltages. In some embodiments, the interfaces may deliver electrical power with two phases at 60 Hz and 120 V or 240 V with amperages of 15 A, 20 A, 30 A, 50 A, or 60 A at each respective receptacle. Thus, some terminal pillars at each site may include one, two, three, four, five, or more distinct electrical receptacles into which a vehicle or appliance can be plugged, in some cases with multiple instances of receptacles at a given configuration of electrical power. In some embodiments, these different interfaces may have different arrangements of electrical receptacle holes in in different shapes of those holes, in some cases with three sets of electrical contacts corresponding to ground, neutral, and hot. Some embodiments may deliver two-phase or three-phase electrical power via some of these interfaces. In some embodiments, the pillars may include a lower portion that extends upward to a height between 2 and 5 feet, like between 3 and 4 feet, and on that lower portion may be mounted an upper portion in which the electrical receptacles are housed along with the components described below with reference to FIG. 2 in the power distribution box in that upper portion. In some embodiments, the power distribution box may provide a weather resistant environment, for example within a metal box in which the below-described electrical components are mounted. In some embodiments, that metal box may act as a Faraday cage impeding wireless network access, and some embodiments may include an antenna routed from inside to outside of the metal box and coupled to the wireless network interfaces therein to mitigate this issue, or some embodiments may use the electrical box or other structural components themselves as an antenna.

In some embodiments, the server system 14 is an on-site server system, in some embodiments, with a different server system co-located each facility or for a collection of facilities, for example, in an on-premises install at an operator's headquarters. Or in some embodiments, the server system 14 is hosted in a remote data center, like in the cloud. In some embodiments, the server system 14 is a hybrid arrangement in which some of the functionality is deployed on-premises while other functionality is remotely hosted in the cloud. Instances of the server system 14 may be replicated across different geographic areas and configured to serve different facilities within those areas to reduce latency. In some embodiments, the server system 14 is implemented as a monolithic application on a single computing device, for instance, in a single virtual machine or container. Or in some cases, the server system 14 is implemented as a collection of services, each service running on a different host, for example, in a distinct computing device, virtual machine, or container in a data center, and those services may communicate with one another via a local area network of the data center, for instance, with rest-based API calls that invoke functionality of the different services. Some embodiments may elastically scale a number of instances of hosts executing services based on demand.

In some embodiments, the server system 14 includes a Web server 26, an application program interface (API) server 28, a meter controller 30, a user profiler 32, a user profile data repository 34, a tenant controller 36, a tenant account data repository 38, and a payments interface 40. In some embodiments, these components may cooperate to execute the process described below with reference to FIG. 3. In some embodiments, the servers 26 and 28 are non-blocking servers implemented with promises or deferred's that register to monitor a network socket of a computing device at an Internet protocol address with which the other components of the computing environment 10 communicate. In some embodiments, web user interfaces are requested and distributed via the Web server 26, while native application user interfaces (such as data by which the user interface display is configured) are requested and distributed via the API servers 28. Further, in some cases, data reported by the power meters 12 to monitor power consumption, and various other metrics indicative of the health the meter, like temperature, current draw, and the like, may be ingested via the API server 28 from messages from the various power meters 12, and in some cases, commands to adjust the configuration of the power meters, like turning on or turning off various types of electrical power or scheduling these events (or providing criteria by which they are triggered), may be communicated via the API server 28 to the power meters 12.

The meter controller 30 may receive the messages indicating state of the power meters 12, like configuration states or metrics from various sensors, and control the operations of the server system 14 in relation to the power meters 12. In some embodiments, the meter controller 30 may log ingested data in a power meter data repository, and some cases updating metrics of aggregate usage in user profiles of users associated with sites at which the consumption is reported, and in some cases updating tenant records, such as facility records, like site records therein and the tenant accounts to indicate aggregate amounts of power consumption, like integrals of power consumption, for instance, indicating an aggregate amount of electrical energy consumed or current rate of electrical energy consumed or historical rates.

In some embodiments, the meter controller may encrypt or cryptographically sign communications to the power meters 12 to reduce the risk of an attacker manipulating power distribution of a facility. In some embodiments, the power meters and server system 14 may be configured within symmetric encryption keys in memory before distribution, for example, at the factory for the power meters 12, and received ciphertext may be decrypted with the symmetric encryption key and sent messages may be encrypted with this symmetric encryption key. In some embodiments, this encryption may be layered within transport layer encryption, like TLS or SSL encryption. In some embodiments, asymmetric encryption may be applied. For example, the power meter and meter controllers may each have a corresponding cryptographic key pair like a public-private cryptographic key pair implemented with RSA, Diffie Hellman, or the like. In some embodiments, messages therebetween may include an identifier of a public key of the sender and an identifier of a public key of the recipient (like the key itself or associated unique identifier). In some embodiments, sent messages may be encrypted with the public key of the recipient, for example, has maintained in memory of the sender. In some embodiments, the recipient may then decrypt the received ciphertext with the recipient's private key that may be maintained in memory in secrecy by the recipient and not distributed to the sender before or after the communication. Further, in some embodiments, senders may cryptographically sign the sent plaintext or sent ciphertext with a private cryptographic key of the sender, and recipients may verify the signature with a public cryptographic key of the sender, for example, confirming that a a cryptographic hash digest of the sent message that was cryptographically signed corresponds to the received information. Upon detecting a discrepancy, the message may be rejected in response to impede man in the middle attacks on the power system. In some embodiments, the meter controller 30 may execute routines described below to monitor, configure, report on, and terminate distribution of electrical power on a site-by-site and amperage-by-amperage basis.

In some embodiments, the server system 14 includes a user profiler 32 configured to construct, update, and interrogate user profiles based upon historical interactions with the server system 14 by user devices 22 or power meters 12 associated with those user account's in a consumption session, like a 24 hour period at an RV Park during which a user account is registered to the power meter 12 and site via one of the user devices 22. In some embodiments, the user profile or 32 may cause user profiles in the repository 34 to be created and updated. In some embodiments, each user profile may include a unique identifier of the user, like a pseudonymous identifier. In some embodiments, each user profile may further include user security credentials, like a username and password, user preferences, user financial information, and user consumption information. In some embodiments, the user profiles may include a list of historical power delivery sessions of the user, and each session record may include a timestamp, a duration, and aggregate amount of electrical energy consumed during the session (in some cases with a time series histogram), in some cases broken out on a amperage-by-amperage basis, and in some cases indicating this type of value on a receptacle-by-receptacle basis. In some embodiments, each session record may include a time series of power consumption on one of these bases or multiple ones of these bases. In some embodiments, other metrics may also be recorded on a session by session, amperage by amperage, or receptacle by receptacle basis, including peak power consumption, peak power consumption for longer than a threshold duration of time, values indicating whether fuses were blown, and the like. In some embodiments, session records may further include similar values for other measured properties, like impedance, temperature, humidity, wind, or other weather-related properties from which models may be trained to predict future electrical power consumption based upon weather forecasts. User profiles may also include various measures of consumption useful for other predictions, like a classification of a timeseries of electrical power delivery, examples including classifying the time series as corresponding to charging a battery, running an air conditioning unit, running a clothes dryer, and the like, as each may present a distinct set of features that may be detected by some embodiments, for instance, with battery charging having a relatively long steady power draw the tapers off, running an air conditioner including a frequency fluctuation of power consumption with the duty cycle on the range of five minutes to an hour, and other forms of energy consumption in being relatively high entropy. Some embodiments may profile users predict future consumption, and modulate consumption thresholds below based on the profiles.

In some embodiments, the user profiles may further include demographic and psychographic attributes of users, for example, supplied by the user in an onboarding process via user interface on the user devices 22 or extracted from a facility operators CRM database. Examples include a home location or preferred travel location of the user, a age gender and income bracket of the user, educational attainment of the user, a number of family members or people with whom the user travels, demographic attributes of those family members or other travel companions, whether the user travels with the pet, and attributes of the pet, like species and breed and age and weight. In some embodiments, user profiles may further include geographic user profiles, for example, indicating durations of stays at sites, frequencies of his stays, clusters of geolocations of stays, aggregate statistics for regions including multiple facilities, starting and ending times of stays, seasons of stays, and purchase patterns during stays. Some embodiments may further include classifications of sites during the stays, for example, indicating whether a premium or non-premium site was selected or whether other services described herein where were purchased. Some embodiments of server system 14 may use this information to predict future consumption; select users for various messages, rewards or incentives; administer loyalty programs; and the like, e.g., e.g., with a neural net classifier or trained decision tree trained with the techniques described herein.

In some embodiments, the tenant controller 36 may interface with the admin devices 24 to configure facilities, present reports, send alarms, and the like. In some embodiments, the tenant controller 36 interfaces with the web interface or native application interface on the admin devices 24 to present dashboards or other report showing current consumption of electrical power, a set of outliers of consumption of electrical power, a list of sites or users using more than a threshold amount electrical power or otherwise exceeding a threshold for one of the above-describe metrics of consumption, a list of users having profiles satisfying various criteria of loyalty or rewards program to designate those users for special attention and care, and the like. In some embodiments, the administrator user interface may further include a set of screens in which inputs are presented by which administrators may select sites, amperage outputs at those sites, or receptacles at those amperage outputs to turn on or turn off political power or review current or historical energy consumption, in some cases along with associated identifiers of users visiting the sites and registered to use the sites via the present native application on user devices 22.

In some embodiments, the tenant controller 36 may create and update tenant accounts 38 with records received with inputs received via the admin devices 24. In some embodiments, tenant accounts may include a unique identifier of tenants, a set of facility records for each facility controlled by that tenant, preferences of the tenant for each facility, and information about the facilities, like identifiers of power meters at those facilities, numbers of power meters, contact information for staff at the facility, and the like. In some embodiments, the tenant records may further include geo-locations of the facilities, bounding polygons of the facilities with latitude and longitude coordinates, maps of the facilities, images of the facilities, and the like.

In some embodiments, native applications on user devices 22 may poll geolocation services on the user devices (or register to receive related events) to determine whether the user device is in any of the facilities for which the tenant accounts 38 have records. In some cases, user devices or the server system 14 may pre-configure user interfaces on user devices with information about a facility at which the user device is determined to be located based on a comparison between the sensed geolocation and locations of facilities in the tenant accounts 38, for example, pre-populating a user interface with an RV park at which the user is located. Further, some embodiments may use the maps of the facilities in the tenant accounts to construct routing (e.g., driving) instructions to a site at which the user is registered and present those routing instructions via the user device 22, in some cases handing off the routing operation to a mapping application on that device with a API call configured according to the facility maps.

In some embodiments, the payments interface 40 may be configured to debit or credit users financial accounts by interfacing with various banks or payment processors based on information received via the user interface is on the user devices 22 to purchase electrical power or other services described herein. Balances and amounts paid may be recorded in corresponding records in the user profile repository 34 and tenant account repository 38.

The user devices 22 may be any of a variety of different kinds of computing devices possessed by users visiting sites at the facilities 16 and 18. Examples include smart phones, tablet computers, laptop computers, desktop computers, in-dash automotive computers, wearable computing devices, and the like. In some embodiments, user computing devices 22 include a portable battery and the features of the computing device described below with reference to FIG. 4, in some cases along with a cellular radio and a Wi-Fi radio. In some embodiments, the user devices 22 include a camera, which in some cases may be used by a native application of the present system executing on the device to capture an image of a QR code, barcode, or other optical code at a physical site at one of the facilities to identify the site within the native application. Or some embodiments may use Bluetooth beacons or other wireless beacons to associate the geolocation of the user device with a particular site for which records are maintained by the illustrated computing environment 10. In some embodiments, the user devices 22 each execute an operating system in which a native application or web browser is run that presents various user interfaces by which users access functionality of the service system 14 to control power meters 12. In some embodiments the display screens are touchscreens in the user interfaces with touch interfaces. Reference to the singular "user interface" includes a sequence of display configurations that unfold over time and have various regions of the display screen maps to event handlers that invoke corresponding functionality and program code.

In some embodiments, the user devices 22 may have an integrated electronic wallet application by which payment activities described herein are effectuated, in some cases, including with biometric measurements, like a fingerprint or facial recognition measurement, along with supplying a pin code, in some embodiments. Some embodiments of the native application may be configured to invoke the local payment application via an application program interface call on the mobile device or via the server system 14.

Admin devices 24 may be possessed by employees or owners of the various facilities 14 having tenant accounts within the server system 14. The admin devices 24 may be the same or different types of computing devices like those described above with reference to the user devices 22. In some embodiments, administrators engage with the server system 14 via a web interface or engage with the server system 14 via a native application.

Figure 2:
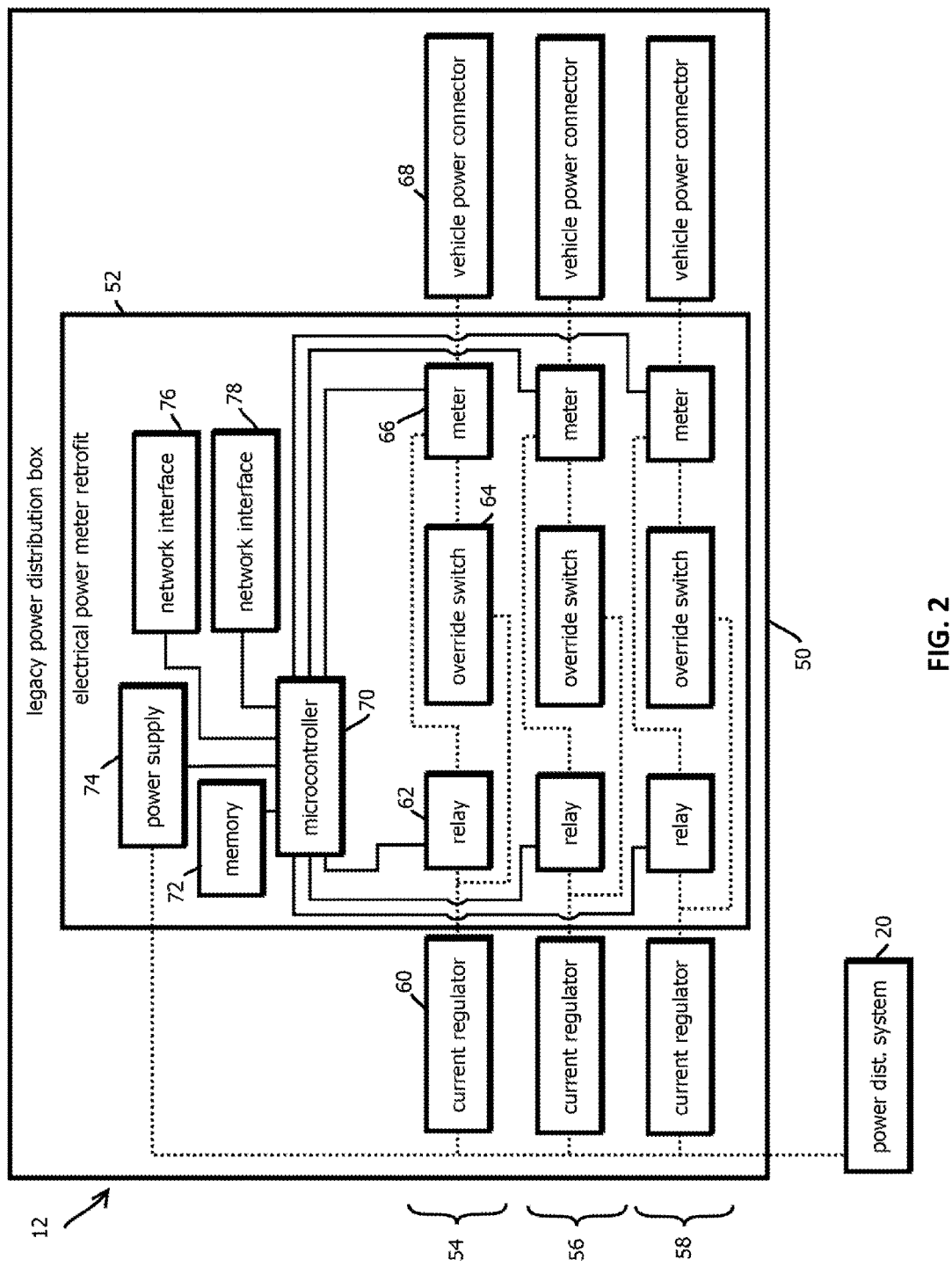
FIG. 2 is a block diagram showing an example of a legacy power distribution box that has been retrofit with an electrical power meter in accordance with some embodiments of the present techniques.

FIG. 2 shows an example of a power meter 12 like that depicted in FIG. 1. In this example, the power meter 12 is a retrofit to a legacy power distribution box 50 at a site, which may host and provide power to different vehicles at different times (e.g., on different days). The power meter may be characterized as "power management unit" or "resource management device," and embodiments are contemplated as having features beyond mere metering of power. The retrofit may include an electrical power meter retrofit kit 52 disposed within the legacy power distribution box 50. Here, and above, connections that convey electrical power for purposes of driving a load are shown with dotted lines, while connections that convey information, which may be in the form of a change in voltage (e.g., less than 20 volts, like 5 or fewer volts, at less than 100 milliamps) or an optical signal or other types of signals, are shown in solid lines. In this example, the electrical power meter retrofit kit 52 may be one or more printed circuit boards having dimensions of less than 6 inches 8 inches, 6 inches, or 4 inches on each side of a rectangular shape, for instance with printed circuit boards having between one and four (inclusive) layers of traces. In some embodiments, the one or more circuit boards are mounted to the side wall of a metal container of the legacy power distribution box 50, for example in a vertical position, by insulating or conductive offsets, so that the retrofit kit 50 benefits from the weather protection of the box 50. In some cases, four pins may hold a pair of boards in spaced relation by passing through apertures (e.g., holes or channels) in each board and including spacers between the bottom board and the side-wall of the box and between the underlying board and the top board.

In this example, the box 50 includes three distinct power paths 54, 56, and 58, each configured to deliver a different configuration of electrical power, for instance at a different voltage, amperage, number of phases, AC, or DC, or the like. For example, electrical power paths 54 may be for a 20-amp source of electrical power, paths 56 may be for a 30-amp source of electrical power, and power path 58 may be for a 50- or 60-amp source of electrical power. Each power path may include a current regulator 60 or other circuitry configured to transform a shared source of electrical power from the distribution system 20 into the various described configurations. Some examples may further include a low-pass filter, a rectifier, a transformer, and alternator, and the like to perform the above-described types of electrical power configuration. In some embodiments, each power path 54, 56, and 58 may further include path-specific fuses, which in some cases, may be mounted with a switch external to a secure area of the power box, with the body of the fuse and other illustrated components being disposed within the secure area, e.g., a rectangular prism with metal walls and a hinged panel secured with a mechanical lock for which a park operator has a key. The paths 54, 56, and 58 terminate with vehicle power connectors 68 for each path. In some embodiments, each connector corresponds to an electrical receptacle, and some paths may connect to multiple receptacles or in some cases each receptacle may have its own distinct path for independent control or monitoring. In some embodiments, each path may be independently controlled by the retrofit kit 52, such that one path may be open, while another is closed. In some embodiments, multiple receptacles may have independent monitoring but be controlled by the same switch.

In some embodiments, the vehicle power connectors 68 have different physical configurations, with different shapes of holes and arrangements of electrical contacts for different standards. Other types of power connectors may also be used, such as those that are not dedicated to supplying vehicles. In some embodiments, the vehicle is an electric vehicle, and the power connector delivers electrical power to charge the vehicle's battery. Or in some embodiments, the vehicle is an internal combustion engine powered vehicle, and the power connector delivers power to drive various appliances on the vehicle, like household appliances within a recreational vehicle, examples including electrical stoves, air conditioners, heat pumps, heaters, televisions, computers, washers, dryers, and the like. In some embodiments, the vehicle power connector 68 are separated from other illustrated components by a bulkhead wall that isolates the other power components in the secure area from physical contact by a user by a wall providing physical access to the connectors 68.

In some embodiments, the retrofit kit 52 may instead be original equipment within the power distribution box 50, for example, in a newly manufactured box that does not require a retrofit. The electrical power meter retrofit 52 may include, in each power path 54, 56, and 58, a relay switch 62 a manual override switch 64, an electrical power meter sensor 66, and various other hardware components, like light emitting diodes or LCD displays that display a state of the output of the path. In some embodiments, some of the circuitry by which power output is configured may be disposed within the path and configured by the microcontroller 70, for instance, to effectuate selection among different transformers to select different DC outputs at different voltages.

The relay 62 may receive electrical power from the current regulator 60 or other power configuration hardware. In some embodiments, the relay 62 is connected to the microcontroller 70, or intervening driver circuitry (e.g., a transistor with a gate controlled by a 5 volt output of the controller, a source connected to a higher-voltage power source, and a drain connected to the control line of the relay 62), by a control line, the logical state of which controls whether the relay 62 is an open or closed state, thereby selectively adjusting whether electrical power is delivered via the relay. In some embodiments, the relays are thyristors, solid state relays, solenoid switches, or other electrically controlled switches.

In some embodiments, a manual override switch 64 may be connected in series between the current regulator 60 and the meter 66 and in parallel relative to the relay 62, such that the manual override switch 64 can be manually changed since state to bypass the relay 62 and conduct electrical power without regard to the state of the relay 62. In some embodiments, the state of the relay 62 and the state of the override switch 64 may be characterized as an or gate in which electrical power is delivered as long as at least one of the states of the two devices is in the on, or logical true, state. The output of the relay 62 in the override switch 64 may connect to an electrical power meter 66, which in some cases may be a current meter, power meter, voltage meter, or other sensor configured to sense an amount of electrical power being delivered, which in some cases may be done by sensing a value indicative of the amount of electrical power, e.g., sensing current and assuming a voltage drop. The output of the meter 66 may then be provided via a conductive path to the vehicle power connector 68 for delivery to a user. The meters 66 may further include an output signal to the microcontroller 70, and in some cases intervening driver circuitry, e.g., reversing the arrangement of the driver circuit above, with a controller-appropriate voltage on the source of the transistor, the gate connected to the output, and the drain connected to a GPIO pin of the controller, or replicating this arrangement for a plurality of pins and a plurality of gates having different threshold voltages to readout a more granular value. The output may provide a signal by which the microcontroller reads out a state of the meter 66, such as a measured amount of electrical power being delivered. In some embodiments, the meter 66 may have on board logic configured to detect various classes of events and send an interrupt to the microcontroller 70 from which a description of the event may be read via registers of the meter 66, for example via a bus connecting the microcontroller 72 the meter 66. Or in some cases, the meter 66 may include a set of registers that are polled by the microcontroller 70 periodically to read-out a value indicative of the current measured amount electrical power. In some embodiments, a voltage or current driven by the meter or impedance or resistance presented by the meter 66 may be polled by driver circuitry coupled to the microcontroller 70 to read-out measured values indicative of consumption of electrical power. In the illustrated arrangement, the microcontroller 70 is connected to relay 62 and meters 66 via a star topology, but embodiments are consistent with other typologies, such as a topology in which the different components sit at different addresses on a bus configured to communicate with various protocols, like an RS-232 bus, Modbus, M-BUS, S7, SNMP, BACnet, or the like.

In some embodiments, the microcontroller 70 may execute routines to implement the logical functionality of the electrical power meter retrofit 52 described elsewhere herein. In some embodiments, the microcontroller 70 is an 8, 16, 32, or 64 (or higher or lower)-bit microcontroller. In some embodiments, the microcontroller 70 is a central processing unit, a digital signal processor, or other form of logic configured to implement the techniques described herein. The microcontroller may be implemented with discrete components, as a FPGA, or an ASIC, e.g., as a system on a chip. The microcontroller 70 may be connected to memory 72 (e.g., integrated memory on a SoC) that stores program routines, buffer data, and state of those program routines for access by the microcontroller 70. In some embodiments, the memory 72 includes persistent and non-persistent memory, like random-access memory and flash memory that maintains estate in the absence of electrical power.

In some embodiments, the retrofit kit 52 further includes a power supply 74 drawing power from the power distribution system 70, or some embodiments may draw power from one of the conditioned sources of power having an appropriate configuration, for example, from between the current regulator 60 and one of the relays 62 so that power delivery is independent of state of the relays. In some embodiments, the power supply 74 includes a separate body of power configuration circuitry, like a transformer configured to deliver 3, 5, 12, or 40 V DC electrical power. In some embodiments, the power supply 74 further includes a backup battery or other source of electrical power, like a connection to a photovoltaic solar cell on an external top portion of the box 52 or otherwise connected to the box 50.

It some embodiments, the microcontroller 70 may further be connected to network interfaces 76 and 78. Two network interfaces are shown, corresponding to two different types of networks having different protocols, but embodiments are consistent with a single network interface or more network interfaces, such as more wireless network interfaces. In some embodiments, network interface 76 is a Wi-Fi network interface (e.g., integrated in a SoC), while network interface 78 is a cellular network interface (e.g., not integrated in a SoC), each having a corresponding radio, driver, and in some cases direct memory access into memory 72 access by firmware of the network interfaces 76 and 78 to write or read data being sent or received into addresses at which the data is accessed by a corresponding driver operated by the microcontroller 70 to route the data via a network socket of the microcontroller 70 and via the appropriate server process (or interrupt handler) executed by the microcontroller 70 to process that data.

Figure 3:
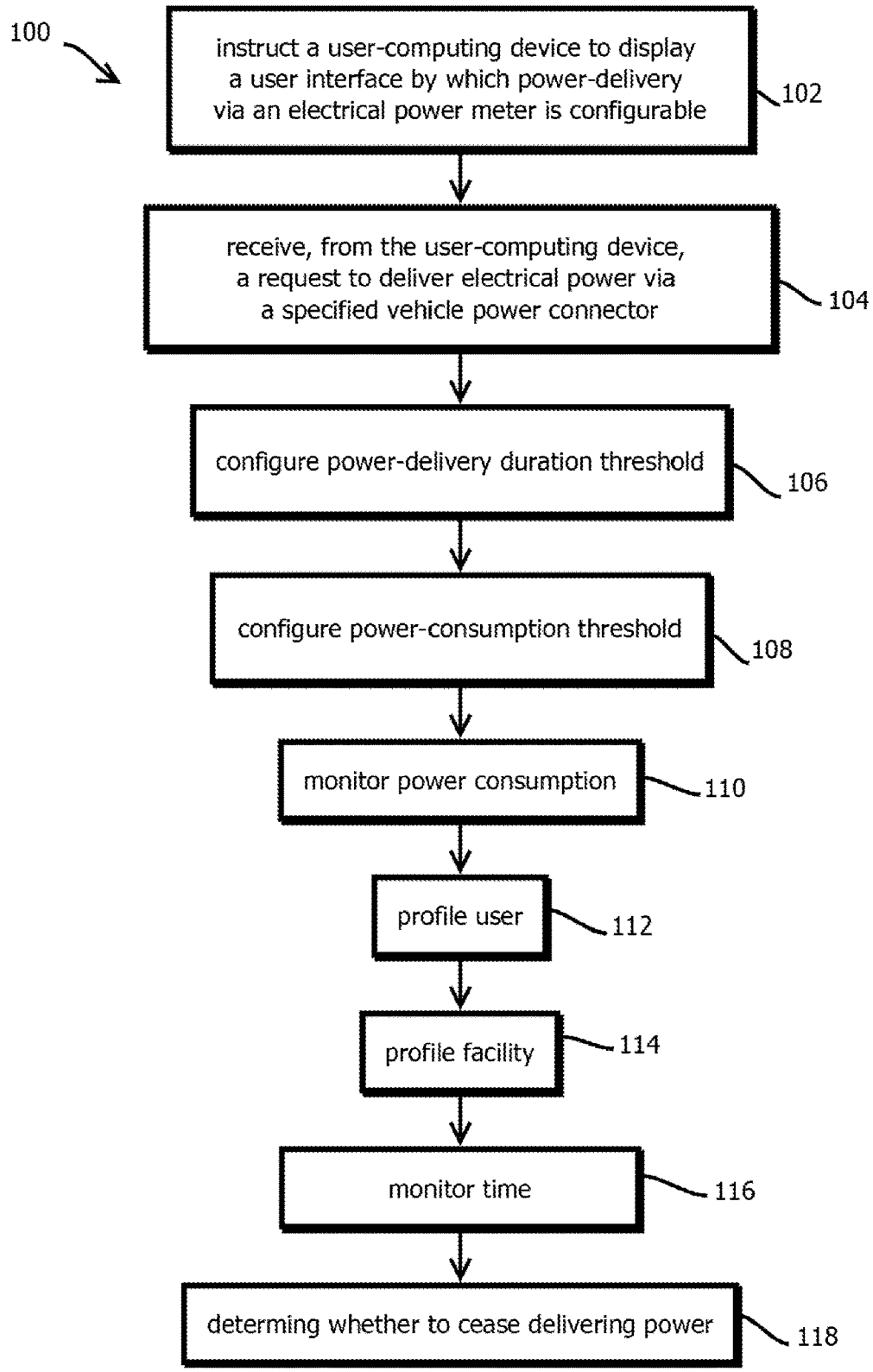
FIG. 3 is a flowchart showing an example of a power distribution process in accordance with some embodiments of the present techniques.

FIG. 3 shows an example of a process 100 that may be executed by the above-described systems. In some embodiments, operations by which the described functionality is effectuated may be stored in the form of program code on one or more tangible, non-transitory, machine-readable media. In some embodiments, the process 100 may be executed by the above-described server system 14, or some or all of the described operations may be offloaded to the other described components, for example to the power meters. In some embodiments, the illustrated operations may be executed in a different order, some subsets of the operations may be executed multiple times before other subsets are executed, additional operations may be inserted, some operations may be omitted, or some or all of the operations may be executed concurrently multiple times in multiple sessions, none of which is to suggest that any other feature described herein is intended to be limited to the described arrangement.

In some embodiments, the process 100 includes instructing a user computing device to display user interface by which power delivery via an electrical power meter is configurable, as indicated by block 102. In some embodiments, the instruction may take the form of HTML, JavaScript, and various assets, like images and fonts and styling sheets, sent to a web browser executing on a user computing device from the server 14. In some embodiments, the instruction may take the form of data sent to a native application and used by the native application to configure the user interface, e.g., a JSON document or XML document. In some embodiments, the instruction may be responsive to a user supplying their credentials to access a user account. Some embodiments include verifying that the credentials are correct. In some embodiments, the credential may include a cryptographic hash of a user supplied credential, like a password, and some embodiments may determine whether a cryptographic hash stored in memory matches that received, such that the server-side operation does not access the password in plain text form during verification, as the cryptographic hash sent may be computed client-side.

In some embodiments, the instruction at step 102 may include instructing a user computing device to display a screen specific to a given facility, site, or power delivery channel. In some embodiments, this pre-configuration may be performed by the user computing device polling a geolocation service of the OS of the user computing device and then determining either server-side or client-side which facility is closest to that geolocation or which site is closest to that geolocation or is otherwise within some threshold distance. Or some embodiments may query a reservation system to determine a reserved site associated with the user account (e.g., in a tenant account or connected tenant reservation system accessed via an API). Some embodiments may preconfigure the user interface based upon a user supplied identifier of the site, like a scan of an optical code at the site or a received wireless beacon identifier from a BLE or NFC transmitter at the site.

Some embodiments may then receive, from the user computing device, a request to deliver electrical power via a specified vehicle power connector, as indicated by block 104. The request may specify a site, a facility, a power configuration, and a duration. The request may identify power channels selected by the user in the user interface supplied in association with operation 102 and those identifiers may be associated with values configuring the request for electrical power. In some embodiments, the user interface may present options by which a user may request electrical power for a specified duration of time, a specified aggregate amount of electrical energy, and a specified receptacle or power delivery path at a specified site. In some embodiments, the duration of time may be specified in terms of a window starting at some point in the future, starting concurrently, and running for a specified duration or specified at a certain time, for instance at 10 AM the following day, regardless of when power delivery starts.

Some embodiments may then configure power-delivery duration thresholds, as indicated by block 106, and configure power-consumption thresholds, as indicated by block 108. In some cases, the duration and consumption thresholds may correspond to how long power is delivered and an amount, like a maximum amount, of power of energy consumed during that duration. In some embodiments, the configuration may entail just changing a binary value indicating that a single candidate configuration is now enabled. In some embodiments, this may include receive a user selecting values by which embodiments compute any of those values. For example, a user may request electrical power for the next 24 hours on a specified amperage output, and the system may default to a threshold maximum amount of consumption for that type of power delivery. In some embodiments, the consumption threshold may be selected based upon the configuration of electrical power, for example with different thresholds of consumption applied to different amperage is. In some embodiments, the same consumption threshold may be applied, or some embodiments may only apply one of the thresholds for duration or consumption without applying the other, which is not to suggest that any other feature described herein may not also be omitted in some embodiments. In some embodiments, the consumption threshold may be specified via the administrator devices 24, for example, by specifying that no site should consume more than a certain number of kilowatt hours within a 24-hour period.

In some embodiments, the consumption threshold may be selected based upon a state of a power generation system at the facility, for example a state of a battery system supplied by photovoltaic power to ration power on cloudy days. In some patient cases, the consumption threshold may be determined based upon other sites at the facility to manage and aggregate load of the power distribution system. For example, a lower consumption threshold may be determined responsive to a larger number of sites being configured to deliver power on one day than another in which a higher consumption threshold is applied. In some embodiments, a variety of different types of consumption thresholds may be configured, for example, a maximum consumption threshold over some specified duration, a peak maximum consumption threshold for any given instance, and aggregate consumption threshold across all receptacles all or all power delivery channels at a specific site, or the like.

Some embodiments may send the computer thresholds to the microcontroller 70 of the electrical power meter retrofit kit 52 described above, and the microcontroller 70 may implement these thresholds. In some embodiments, the above-described cryptographic security techniques may be applied to these communications. Managing the thresholds locally on the power meter, and loading these values to the power meter before the power meter starts delivering electrical power, is expected to defeat or impair user attacks to steal electricity after the purchase duration by impairing wireless access of the meter, for instance, by wrapping the metering in aluminum foil to create a Faraday cage the blocks communication with server 14. In that scenario, the microcontroller 70 may continue to apply the threshold stored in memory, ceasing to provide power at the designated time or upon the designated amount of consumption, regardless of whether network access is available at that particular time. Or in some embodiments, the determination to cease delivering electrical power may be made remotely at the server system 14.

In some embodiments, the server system 14 or the microcontroller 70 may monitor power consumption, as indicated by block 110. In some embodiments, monitoring power consumption may include polling registers of the electrical power meter 66, converting an analog voltage signal into a binary value with a digital signal processor, or receiving interrupts or other messages from the power meter 66 indicative of new data about power consumption ready to be read from registers of the meter. The received metrics may be buffered by the microcontroller 70 in memory 72 to compute aggregate values periodically, apply low-pass filters, and accumulate data during periods of intermittent network access loss before the accumulated data is sent to the server 14. The metrics (e.g., in raw form as received from the meter or after various transformations like those described above) may be compared against thresholds, along with a time signal from a clock, for example implemented with a vibrating crystal and a counter, to determine whether to cease delivering electrical power responsive to one of the thresholds being exceeded.

In some embodiments, different thresholds may be applied to each of the different power delivery paths 54, 56, and 58. For example, a user may purchase electrical power delivery on path 54 for the next six hours to charge the electric battery of their electrical truck pulling their fifth wheel, and purchase electrical power for the next three days on path 56 to supply power to their fifth wheel RV pulled by that truck.

In some embodiments, power delivery may be reversed, for example, with net metering, and electrical power may be pulled from batteries coupled to the vehicle power connector 66 to load balance within a facility. In some embodiments, the microcontroller 70 may adjust the thresholds to increase a user's allotted time or communicate a command back to the server system 14 to creditor users account based on the amount of electrical power pulled from their battery.

As indicated, some embodiments may profile users, as shown in block 112. This may include updating the above-describe user profiles based upon consumption time series or consumption session classifications reported back by the microcontroller 70, for instance classifying the user as a low medium or high consumer, classifying the user as having one, two, three, four, or five different loads, like vehicles connected, or otherwise characterizing the users power consumption. Or in some cases, these classifications may be performed server-side with machine learning algorithms trained upon historical time series of reported power consumption and known user profiles, for example, supplied with surveys. For example, some embodiments may classify users as having a certain number of vehicles and classify those vehicles as being electrically powered, being recreational vehicles, or the like, based upon patterns in this data. Examples include decision trees, for instance random forest decision trees trained with CART or and deep neural network classifiers trained with stochastic gradient descent.

Some embodiments may further profile the facility, as indicated by block 114. In some embodiments, this may include operation server-side the aggregate data across a plurality of different sites of the facility and populate facility records indicative of those aggregate amounts of consumption. These values may be accessed and displayed visualizations for various dashboards of facility operators.

Some embodiments may further monitor an amount of time, as indicated by block six 116, over which power has been delivered in a given power delivery session. In some cases, this may include executing a loop in the microcontroller 70 that every cycle checks consumption thresholds and time thresholds. In some embodiments, the microcontroller 70 may access the counter coupled to a vibrating crystal to determine a current time, and compare that time to a threshold. In some embodiments, the comparison is between a duration of time of power delivery and a threshold duration of delivery. In some cases, the comparisons between a current time and a shut off time.

Some embodiments may determine whether to cease delivering electrical power responsive to the above-describe types of monitoring, as indicated by block 118. In some embodiments, determination may be made for each power delivery path 54, 56, and 58 with a certain frequency, for instance, once every 15 minutes, once every minute, once every second, once every 500 ms, or once every 50 ms or more or less frequently. Upon determining to cease delivering power, microcontroller 70 may transmit a signal, like a change in voltage state, along one of the traces connected to the relay 62 to cause the corresponding relay for which the determination applies to change state and enter an open state, leaving the closed state through which power was delivered.

In some embodiments, the power distribution box 50 may be configured to provide various warnings, like an audible alarm, flashing lights, or some other indication some duration of time before changing state of her relay. Some embodiments made apply distinct thresholds at which these signals are presented to users, for instance applying a threshold computed to be 15 minutes before they purchase duration of time for power delivery of expires or at 99% of a threshold amount of maximum power consumption where power shut off. Some embodiments may apply thresholds to determine whether to send a message via a network (e.g., email or SMS) to a facility operator, e.g., indicative of anomalous usage that they may wish to physically inspect or inquire about. Thus, in some cases, upon each cycle of a monitoring loop executed by the microcontroller 70, the microcontroller 70 may apply a dozen or more different comparisons to determine whether the time is occurred to give a warning alarm or cease delivering electrical power on each path.

As indicated above, various services may be layered onto the illustrative hardware to leverage the existence of logic and wireless network connections at each of the sites in a facility. Examples include providing wireless network access to users, for example via user devices or other computing devices at the site. Some embodiments may include multiple wireless network interfaces in the retrofit kit, with one network interface providing a connection to the Internet via a cellular tower and the other providing a local area wireless network, like a Wi-Fi network access point or a Zigbee node. In some embodiments, users may purchase access to these wireless networks or other services described herein via the above-described native application or webpage or website on the user computing devices 22 via the server system 14. In some embodiments, a subset of retrofit kits in a facility may include two network interfaces while other retrofit kits only include one, and embodiments may provide multi-hop wireless network meshed mesh networking where a single cellular connection is shared across multiple sites via Wi-Fi connections between the sites. Or some embodiments may include a wired Ethernet network connection to one of the sites and other sites may connect to that wired ethernet connection via multi-hop Wi-Fi connections, Zigbee connections, or other mesh network connections throughout a facility. Thus, a single command to a single microcontroller 70 may be routed through one retrofit kit 52 wisely transmitted to another, wirelessly transmitted to yet another, and then be received by the target retrofit kit. Reported data may be conveyed back in a similar matter. Reported data may be buffered in memory and sent responsive to a determination that wireless network access has been regained in scenarios in which wireless network access is lost temporarily. In some embodiments, one of the network interfaces 76 or 78 is to a low Earth orbit satellite Internet network expected to offer coverage in relatively rural areas, for example, from Starlink, Oneweb, or other providers.

A variety of other services may also be applied by leveraging the logic and wireless networking distributed throughout a facility with the retrofit kits. Some embodiments may selectively control solenoid valves in series in water delivery lines at the sites to selectively provide access to water, in some cases applying the above-describe consumption amount and duration of time thresholds to water consumption rather than electrical power consumption. Some embodiments may selectively provide access to streaming content, like videos hosted locally at the facility in a server on-site or remotely via the network interfaces (e.g., from a server on-site, via a mesh network, to a user's computer via a WiFi access point provided by the power box). Some embodiments may include security cameras, fire detectors, and other sensor suites or communication equipment at the site coupled to the retrofit kits and leveraging the processing power, memory, and network interfaces of the retrofit kits to provide emergency services, security services, and the like at sites of facilities like those described above. In some embodiments, configuration and use of these services may be recorded in user profiles like those described above Some embodiments may leverage the mobile application to interface with other systems at a facility. For example, some embodiments may store in memory of the native application a key value that may be conveyed by the native application by NFC, Bluetooth, or on a display screen, to a smart lock or other networked actuator at a facility (e.g., a pool gate lock, a road gate lock, or the like) to selectively provide access during a user's stay. In some cases, these keys may be disabled at the time the scheduled stay ends. Some embodiments may interface with a facilities reservation system to add these values to memory of the native application. Some embodiments may also provide facility specific content via the native application, like maps, schedules, events, and recommendations.

Some embodiments may be configured to analyze user profiles to classify users into various groups based upon use of power on-site. For example, some embodiments may classify users as "whales" based upon a relatively large amount of engagement with services at the facility or collection of facilities of a tenant. Some embodiments may classify vehicles based on these profiles, e.g., detecting an amount of time a user has had an RV and targeting that user for content responsive to a determination that a warranty period is about to expire.

Figure 4:
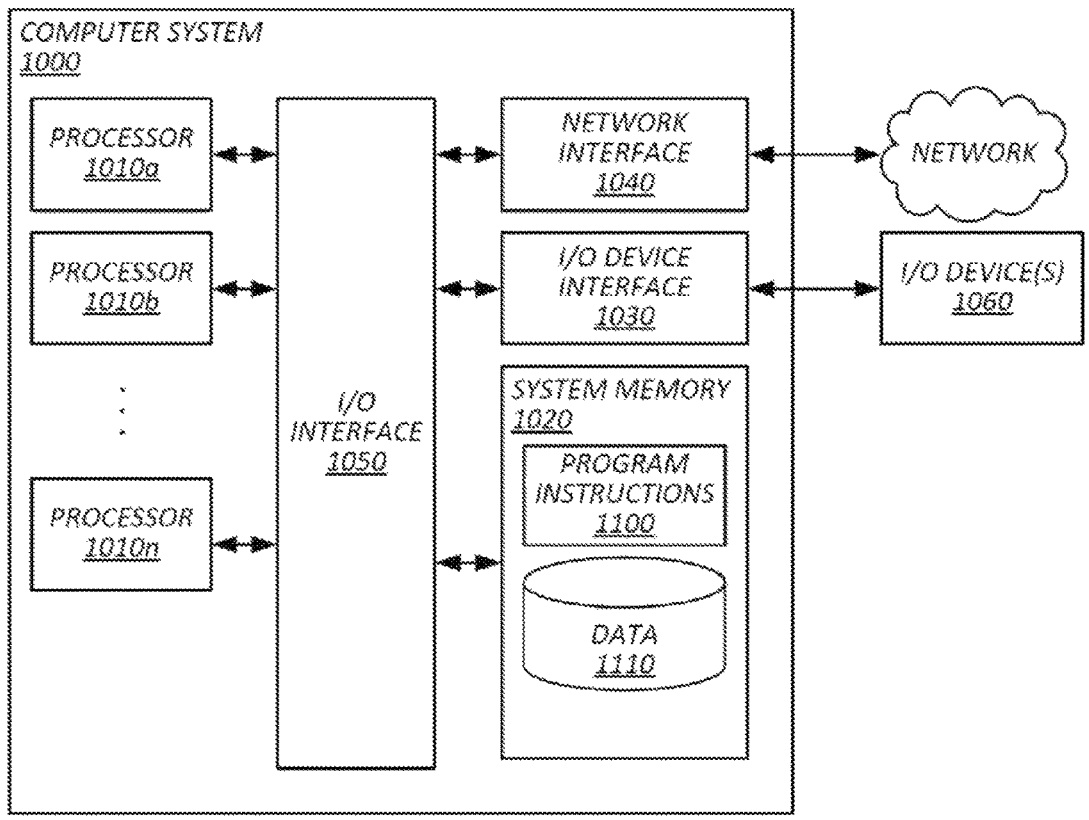
FIG. 4 is a block diagram showing an example of a computing device by which some embodiments of the present techniques may be implemented.

FIG. 4 is a diagram that illustrates an exemplary computing system 1000 in accordance with embodiments of the present technique. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM and/or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device and/or a plurality of memory devices (e.g., distributed memory devices). Instructions or other program code to provide the functionality described herein may be stored on a tangible, non-transitory computer readable media. In some cases, the entire set of instructions may be stored concurrently on the media, or in some cases, different parts of the instructions may be stored on the same media at different times.

I/O interface 1050 may be configured to coordinate I/O traffic between processors 1010a-1010n, system memory 1020, network interface 1040, IO devices 1060, and/or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present techniques may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, notwithstanding use of the singular term "medium," the instructions may be distributed on different storage devices associated with different computing devices, for instance, with each computing device having a different subset of the instructions, an implementation consistent with usage of the singular term "medium" herein. In some cases, third party content delivery networks may host some or all of the information conveyed over networks, in which case, to the extent information (e.g., content) is said to be supplied or otherwise provided, the information may provided by sending instructions to retrieve that information from a content delivery network.

The reader should appreciate that the present application describes several independently useful techniques. Rather than separating those techniques into multiple isolated patent applications, applicants have grouped these techniques into a single document because their related subject matter lends itself to economies in the application process. But the distinct advantages and aspects of such techniques should not be conflated. In some cases, embodiments address all of the deficiencies noted herein, but it should be understood that the techniques are independently useful, and some embodiments address only a subset of such problems or offer other, unmentioned benefits that will be apparent to those of skill in the art reviewing the present disclosure. Due to costs constraints, some techniques disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such techniques or all aspects of such techniques.

It should be understood that the description and the drawings are not intended to limit the present techniques to the particular form disclosed, but to the contrary, the intention is to cover all modifications, equivalents, and alternatives falling within the spirit and scope of the present techniques as defined by the appended claims. Further modifications and alternative embodiments of various aspects of the techniques will be apparent to those skilled in the art in view of this description. Accordingly, this description and the drawings are to be construed as illustrative only and are for the purpose of teaching those skilled in the art the general manner of carrying out the present techniques. It is to be understood that the forms of the present techniques shown and described herein are to be taken as examples of embodiments. Elements and materials may be substituted for those illustrated and described herein, parts and processes may be reversed or omitted, and certain features of the present techniques may be utilized independently, all as would be apparent to one skilled in the art after having the benefit of this description of the present techniques. Changes may be made in the elements described herein without departing from the spirit and scope of the present techniques as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Statements referring to "at least Z of A, B, and C," and the like (e.g., "at least Z of A, B, or C"), refer to at least Z of the listed categories (A, B, and C) and do not require at least Z units in each category. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device. Features described with reference to geometric constructs, like "parallel," "perpendicular/orthogonal," "square", "cylindrical," and the like, should be construed as encompassing items that substantially embody the properties of the geometric construct, e.g., reference to "parallel" surfaces encompasses substantially parallel surfaces. The permitted range of deviation from Platonic ideals of these geometric constructs is to be determined with reference to ranges in the specification, and where such ranges are not stated, with reference to industry norms in the field of use, and where such ranges are not defined, with reference to industry norms in the field of manufacturing of the designated feature, and where such ranges are not defined, features substantially embodying a geometric construct should be construed to include those features within 15% of the defining attributes of that geometric construct. The terms "first", "second", "third," "given" and so on, if used in the claims, are used to distinguish or otherwise identify, and not to show a sequential or numerical limitation. As is the case in ordinary usage in the field, data structures and formats described with reference to uses salient to a human need not be presented in a human-intelligible format to constitute the described data structure or format, e.g., text need not be rendered or even encoded in Unicode or ASCII to constitute text; images, maps, and data-visualizations need not be displayed or decoded to constitute images, maps, and data-visualizations, respectively; speech, music, and other audio need not be emitted through a speaker or decoded to constitute speech, music, or other audio, respectively. Computer implemented instructions, commands, and the like are not limited to executable code and can be implemented in the form of data that causes functionality to be invoked, e.g., in the form of arguments of a function or API call.

In this patent, to the extent any U.S. patents, U.S. patent applications, or other materials (e.g., articles) have been incorporated by reference, the text of such materials is only incorporated by reference to the extent that no conflict exists between such material and the statements and drawings set forth herein. In the event of such conflict, the text of the present document governs, and terms in this document should not be given a narrower reading in virtue of the way in which those terms are used in other materials incorporated by reference.

The present techniques will be better understood with reference to the following enumerated embodiments:

1. A system, comprising: a first electrical power meter configured to selectively provide electrical power at a first current amount via a first vehicle power connector and provide electrical power at a second current amount via a second vehicle power connector, the first electrical power meter comprising: a first network interface; one or more electrical power inputs configured to receive electrical power from a power-distribution system of a vehicle facility configured to host a plurality of vehicles; a first electrically controlled switch configured to selectively conduct electrical power from the power-distribution system via the first vehicle power connector; a second electrically controlled switch configured to selectively conduct electrical power from the power-distribution system via the second vehicle power connector; and a first client-side processor coupled to the first network interface, the first electrically controlled switch, and the second electrically controlled switch, wherein the first client-side processor is configured to communicate via the first network interface with a remote server system; and the remote server system, comprising: one or more server-side processors; and memory storing instructions that when executed effectuate operations comprising: causing a user-computing device of a user to display a user interface by which power-delivery via the first electrical power meter is configurable; receiving, from the user-computing device, a request to deliver electrical power via the first vehicle power connector; and in response to receiving the request, transmitting, to the network interface of the first electrical power meter, a command that causes the client-side processor to adjust the first electrically controlled switch to effectuate delivery of electrical power at the first current amount via the first vehicle power connector.

2. The system of embodiment 1, wherein: the vehicle facility is a recreational vehicle facility having a plurality of sites to park recreational vehicles, each of the plurality of sites having an instance of the electrical power meter; the first vehicle power connector is a 30-ampere recreational vehicle power connector; the second vehicle power connector is a 50-ampere recreational vehicle power connector or a 20-ampere recreational vehicle power connector; the first electrical power meter comprises a meter configured to measure an amount of electrical energy delivered to a recreational vehicle via the first electrical power meter; the remote server system is configured to cause the first electrically controlled switch or the second electrically controlled switch to cease delivering electrical power after a measured amount of electrical energy delivered to the recreational vehicle exceeds a threshold amount; the threshold is determined by the remote server system based on user input to the user-computing device and sent by the user-computing device to the remote server system; and the first electrical power meter retrofits a recreational-vehicle pedestal electrical box that, prior to the retrofit, does not include a network interface.

3. The system of any one of embodiments 1-2, wherein: the first electrical power meter is configured to measure an amount of electrical energy consumption by the user via the first electrical power meter; and the remote server system, the first electrical power meter, or both are configured to: cause the first electrical power meter to cease providing electrical power to the user in response to electrical power consumption exceeding a first threshold; and cause the first electrical power meter to cease providing electrical power to the user in response to a duration of time of availability of electrical power consumption exceeding a second threshold.

4. The system of embodiment 3, wherein: the remote server system is configured to determine the first threshold and the second threshold and send the first threshold and the second threshold to the first electric power meter via the network interface; and the first electrical power meter is configured to store the first threshold and the second threshold in memory and later determine, based on the stored first threshold or second threshold, whether to cease providing electrical power to the user without a network connection to the remote server system.

5. The system of any one of embodiments 1-4, wherein the first electrical power meter comprises: an override switch configured to bypass the first electrically controlled switch, the second electrically controlled switch, or both to provide electrical power when the first electrically controlled switch, the second electrically controlled switch, or both are in an open state; and a visual or audible user interface indicative of a state or states of the first electrically controlled switch, the second electrically controlled switch, or both.

6. The system of any one of embodiments 1-5, wherein: the first electrical power meter comprises a third electrically controlled switch configured to selectively conduct electrical power from the power-distribution system via a third vehicle power connector; the first, second, and third electrically controlled switches are different switches from one another; the first, second, and third vehicle power connectors are different power connectors from one another; the first vehicle power connector is a 20-amp recreational vehicle power connector; the second vehicle power connector is a 30-amp recreational vehicle power connector; and the third vehicle power connector is a 50-amp recreational vehicle power connector.

7. The system of any one of embodiments 1-6, comprising: a second electrical power meter configured to selectively provide electrical power at the first current amount via a third vehicle power connector and provide power at the second current amount via a fourth vehicle power connector, the second electrical power meter comprising: a second network interface; one or more electrical power inputs configured to receive electrical power from the power-distribution system of the vehicle facility; a third electrically controlled switch configured to selectively conduct electrical power from the power-distribution system via the third vehicle power connector; a fourth electrically controlled switch configured to selectively conduct electrical power from the power-distribution system via the fourth vehicle power connector; and a second client-side processor coupled to the second network interface, the third electrically controlled switch, and the fourth electrically controlled switch, wherein the second client-side processor is configured to communicate via the second network interface with the remote server system.

8. The system of any one of embodiments 1-7, wherein: the first network interface or another network interface of the first electrical power meter comprises a first wireless network interface through which the first electrical power meter is configured to communicate with the remote server system.

9. The system of embodiment 8, wherein: the first wireless network interface is a cellular or satellite wireless network interface; and the first electrical power meter comprises a second wireless network interface that is different from the first wireless network interface; and the remote server system and the user-computing device are configured to communicate with each other via a message conveyed by both the first wireless network interface and the second wireless network interface.

10. The system of any one of embodiments 1-9, comprising: a plurality of instances of the electrical power meter at different sites in the vehicle facility, the plurality of instances including the first electrical power meter, wherein the plurality of instances of the electrical power meter are configured to form a mesh wireless network via respective network interfaces of the plurality of instances of the electrical power meter, at least some of the plurality of instances of the electrical power meter communicating with the remote server system via other instances of the electrical power meter having access to a different wireless network from the mesh wireless network.

11. The system of any one of embodiments 1-10, wherein: the remote server system is configured to: manage a plurality of sets of electric power meters, each set of electric power meters corresponding to a different tenant account of the remote server system; and provide a tenant user interface by which different tenants are presented with data indicative of utilization of different sets of electric power meters corresponding to the respective tenant.

12. The system of any one of embodiments 1-11, wherein: the first electrical power meter comprises an electrically controlled water valve; and the first client-side processor is configured to cause the electrically controlled water valve to open or close responsive to commands from the remote server system to selectively provide water to a recreational vehicle.

13. The system of embodiment 12, wherein: the first electrical power meter comprises a water meter configured to measure an amount of water consumption; and the remote server system is configured to cause the first electrical power meter to cause the electrically controlled water valve to close responsive to: a threshold time elapsing; a threshold amount of measured water consumption; or both a threshold time elapsing and a threshold amount of measured water consumption.

14. The system of any one of embodiments 1-13, comprising at least one of the following: a security system configured to communicate via the first network interface; an emergency alert system configured to communicate via the first network interface; a video streaming system configured to communicate via the first network interface; or an inventory management system configured to communicate via the first network interface and effectuate delivery of locally stored physical goods to the user.

15. The system of any one of embodiments 1-14, wherein the operations comprise: inferring a number of vehicles used by the user based on user selections among the first vehicle power connector and the first vehicle power connector; storing the number in a profile of the user in memory; and determining to send a message to the user based on the profile.

16. The system of any one of embodiments 1-15, wherein: the first electrical power meter comprises: a first meter configured to measure electrical energy consumption via the first vehicle power connector; and a second meter configured to measure electrical energy consumption via the second vehicle power connector; the client side processor is configured to report electrical energy consumption via the first vehicle power connector and, as a distinct measure, electrical energy consumption via the second vehicle power connector to the remote server system; and the remote server system is configured to store values indicative of reported electrical energy consumption via the first vehicle power connector and electrical energy consumption via the second vehicle power connector in memory in association with an identifier of the user.

17. The system of any one of embodiments 1-16, wherein: the user-computing device comprises memory storing a native application by which the user interface is displayed.

18. The system of embodiment 17, wherein: the native application is configured to cause a user interface pertaining to the first electrical power meter to be customized in response to the user-computing device receiving a wireless signal from the first electrical power meter.

19. The system of any one of embodiments 1-18, wherein the operations comprise: determining a first threshold for electrical energy consumption or power-availability time for the first vehicle power connector based on a first user input via the native application; determining a second threshold for electrical energy consumption or power-availability time for the second vehicle power connector based on a second user input via the native application; causing the first electrical power meter to cease providing electrical power via the first vehicle power connector at a first time in response to determining that the first threshold has been exceeded; and causing the first electrical power meter to cease providing electrical power via the second vehicle power connector at a first time in response to determining that the second threshold has been exceeded, the second time being different from the first time.

20. The system of any one of embodiments 1-19, wherein the first electrical power meter and the remote server system are configured to perform operations comprising: receiving, with the remote server system, a request from the user-computing device to power a second vehicle from a first vehicle; and in response to the request to power a second vehicle from a first vehicle, causing the first electrical power meter to draw power from the first vehicle via the first vehicle power connector and provide at least some of the drawn power to the second vehicle via the second vehicle power connector.

19. A tangible, non-transitory, machine-readable medium storing instructions that when executed by a data processing apparatus cause the data processing apparatus to perform operations comprising the operations of any one of embodiments 1-20.

20. A method, comprising the operations of any one of embodiments 1-20.

What is claimed is:

1. A system, comprising:
a first electrical power meter configured to selectively provide electrical power at a first current amount via a first vehicle power connector and provide electrical power at a second current amount via a second vehicle power connector, the first electrical power meter comprising:
    a first network interface;
    one or more electrical power inputs configured to receive electrical power from a power-distribution system of a vehicle facility configured to host a plurality of vehicles;
    a first electrically controlled switch configured to selectively conduct electrical power from the power-distribution system via the first vehicle power connector;
    a second electrically controlled switch configured to selectively conduct electrical power from the power-distribution system via the second vehicle power connector; and
    a first client-side processor coupled to the first network interface, the first electrically controlled switch, and the second electrically controlled switch, wherein the first client-side processor is configured to communicate via the first network interface with a remote server system; and
the remote server system, comprising:
    one or more server-side processors; and
    memory storing instructions that when executed effectuate operations comprising:
        causing a user-computing device of a user to display a user interface by which power-delivery via the first electrical power meter is configurable;
        receiving, from the user-computing device, a request to deliver electrical power via the first vehicle power connector; and
        in response to receiving the request, transmitting, to the network interface of the first electrical power meter, a command that causes the client-side processor to adjust the first electrically controlled switch to effectuate delivery of electrical power at the first current amount via the first vehicle power connector, wherein:
    the vehicle facility is a recreational vehicle facility having a plurality of sites to park recreational vehicles, each of the plurality of sites having an instance of the electrical power meter;
    the first vehicle power connector is a 30-ampere recreational vehicle power connector;
    the second vehicle power connector is a 50-ampere recreational vehicle power connector or a 20-ampere recreational vehicle power connector;
    the first electrical power meter comprises a meter configured to measure an amount of electrical energy delivered to a recreational vehicle via the first electrical power meter;
    the remote server system is configured to cause the first electrically controlled switch or the second electrically controlled switch to cease delivering electrical power after a measured amount of electrical energy delivered to the recreational vehicle exceeds a threshold amount;
    the threshold is determined by the remote server system based on user input to the user-computing device and sent by the user-computing device to the remote server system; and
    the first electrical power meter retrofits a recreational-vehicle pedestal electrical box that, prior to the retrofit, does not include a network interface.

2. The system of claim 1, wherein:
the first electrical power meter is configured to measure an amount of electrical energy consumption by the user via the first electrical power meter; and
the remote server system, the first electrical power meter, or both are configured to:
    cause the first electrical power meter to cease providing electrical power to the user in response to electrical power consumption exceeding a first threshold; and
    cause the first electrical power meter to cease providing electrical power to the user in response to a duration of time of availability of electrical power consumption exceeding a second threshold.

3. The system of claim 2, wherein:
the remote server system is configured to determine the first threshold and the second threshold and send the first threshold and the second threshold to the first electric power meter via the network interface; and
the first electrical power meter is configured to store the first threshold and the second threshold in memory and later determine, based on the stored first threshold or second threshold, whether to cease providing electrical power to the user without a network connection to the remote server system.

4. The system of claim 1, wherein the first electrical power meter comprises:
an override switch configured to bypass the first electrically controlled switch, the second electrically controlled switch, or both to provide electrical power when the first electrically controlled switch, the second electrically controlled switch, or both are in an open state; and a visual or audible user interface indicative of a state or states of the first electrically controlled switch, the second electrically controlled switch, or both.

5. The system of claim 1, comprising:
a second electrical power meter configured to selectively provide electrical power at the first current amount via a third vehicle power connector and provide power at the second current amount via a fourth vehicle power connector, the second electrical power meter comprising:
 a second network interface;
 one or more electrical power inputs configured to receive electrical power from the power-distribution system of the vehicle facility;
 a third electrically controlled switch configured to selectively conduct electrical power from the power-distribution system via the third vehicle power connector;
 a fourth electrically controlled switch configured to selectively conduct electrical power from the power-distribution system via the fourth vehicle power connector; and
 a second client-side processor coupled to the second network interface, the third electrically controlled switch, and the fourth electrically controlled switch, wherein the second client-side processor is configured to communicate via the second network interface with the remote server system.

6. The system of claim 1, wherein:
the first network interface or another network interface of the first electrical power meter comprises a first wireless network interface through which the first electrical power meter is configured to communicate with the remote server system.

7. The system of claim 6, wherein:
the first wireless network interface is a cellular or satellite wireless network interface; and
the first electrical power meter comprises a second wireless network interface that is different from the first wireless network interface; and
the remote server system and the user-computing device are configured to communicate with each other via a message conveyed by both the first wireless network interface and the second wireless network interface.

8. The system of claim 1, comprising:
a plurality of instances of the electrical power meter at different sites in the vehicle facility, the plurality of instances including the first electrical power meter,
wherein the plurality of instances of the electrical power meter are configured to form a mesh wireless network via respective network interfaces of the plurality of instances of the electrical power meter, at least some of the plurality of instances of the electrical power meter communicating with the remote server system via other instances of the electrical power meter having access to a different wireless network from the mesh wireless network.

9. The system of claim 1, wherein:
the remote server system is configured to:
 manage a plurality of sets of electric power meters, each set of electric power meters corresponding to a different tenant account of the remote server system; and
 provide a tenant user interface by which different tenants are presented with data indicative of utilization of different sets of electric power meters corresponding to the respective tenant.

10. The system of claim 1, wherein:
the first electrical power meter comprises an electrically controlled water valve; and
the first client-side processor is configured to cause the electrically controlled water valve to open or close responsive to commands from the remote server system to selectively provide water to a recreational vehicle.

11. The system of claim 10, wherein:
the first electrical power meter comprises a water meter configured to measure an amount of water consumption; and
the remote server system is configured to cause the first electrical power meter to cause the electrically controlled water valve to close responsive to:
 a threshold time elapsing;
 a threshold amount of measured water consumption; or
 both a threshold time elapsing and a threshold amount of measured water consumption.

12. The system of claim 1, comprising at least one of the following:
a security system configured to communicate via the first network interface;
an emergency alert system configured to communicate via the first network interface;
a video streaming system configured to communicate via the first network interface; or
an inventory management system configured to communicate via the first network interface and effectuate delivery of locally stored physical goods to the user.

13. The system of claim 1, wherein the operations comprise:
inferring a number of vehicles used by the user based on user selections among the first vehicle power connector and the first vehicle power connector;
storing the number in a profile of the user in memory; and
determining to send a message to the user based on the profile.

14. The system of claim 1, wherein:
the first electrical power meter comprises:
 a first meter configured to measure electrical energy consumption via the first vehicle power connector; and
 a second meter configured to measure electrical energy consumption via the second vehicle power connector;
the client side processor is configured to report electrical energy consumption via the first vehicle power connector and, as a distinct measure, electrical energy consumption via the second vehicle power connector to the remote server system; and
the remote server system is configured to store values indicative of reported electrical energy consumption via the first vehicle power connector and electrical energy consumption via the second vehicle power connector in memory in association with an identifier of the user.

15. The system of claim 1, wherein:
the user-computing device comprises memory storing a native application by which the user interface is displayed.

16. The system of claim 15, wherein:
the native application is configured to cause a user interface pertaining to the first electrical power meter to be customized in response to the user-computing device receiving a wireless signal from the first electrical power meter.

17. The system of claim 1, wherein the operations comprise:
   determining a first threshold for electrical energy consumption or power-availability time for the first vehicle power connector based on a first user input via the native application;
   determining a second threshold for electrical energy consumption or power-availability time for the second vehicle power connector based on a second user input via the native application;
   causing the first electrical power meter to cease providing electrical power via the first vehicle power connector at a first time in response to determining that the first threshold has been exceeded; and
   causing the first electrical power meter to cease providing electrical power via the second vehicle power connector at a first time in response to determining that the second threshold has been exceeded, the second time being different from the first time.

18. The system of claim 1, comprising:
   means for retrofitting a power-distribution system to provide self-service power distribution to vehicles at a plurality of different amperages with amperage-specific pre-selected amounts of power or amperage-specific pre-selected durations of time of power availability.

19. The system of claim 1, wherein the first electrical power meter and the remote server system are configured to perform operations comprising:
   receiving, with the remote server system, a request from the user-computing device to power a second vehicle from a first vehicle; and
   in response to the request to power a second vehicle from a first vehicle, causing the first electrical power meter to draw power from the first vehicle via the first vehicle power connector and provide at least some of the drawn power to the second vehicle via the second vehicle power connector.

20. A system, comprising:
   a first electrical power meter configured to selectively provide electrical power at a first current amount via a first vehicle power connector and provide electrical power at a second current amount via a second vehicle power connector, the first electrical power meter comprising:
   a first network interface;
   one or more electrical power inputs configured to receive electrical power from a power-distribution system of a vehicle facility configured to host a plurality of vehicles;
   a first electrically controlled switch configured to selectively conduct electrical power from the power-distribution system via the first vehicle power connector;
   a second electrically controlled switch configured to selectively conduct electrical power from the power-distribution system via the second vehicle power connector; and
   a first client-side processor coupled to the first network interface, the first electrically controlled switch, and the second electrically controlled switch, wherein the first client-side processor is configured to communicate via the first network interface with a remote server system; and
   the remote server system, comprising:
   one or more server-side processors; and
   memory storing instructions that when executed effectuate operations comprising:
   causing a user-computing device of a user to display a user interface by which power-delivery via the first electrical power meter is configurable;
   receiving, from the user-computing device, a request to deliver electrical power via the first vehicle power connector; and
   in response to receiving the request, transmitting, to the network interface of the first electrical power meter, a command that causes the client-side processor to adjust the first electrically controlled switch to effectuate delivery of electrical power at the first current amount via the first vehicle power connector, wherein:
   the first electrical power meter comprises a third electrically controlled switch configured to selectively conduct electrical power from the power-distribution system via a third vehicle power connector;
   the first, second, and third electrically controlled switches are different switches from one another;
   the first, second, and third vehicle power connectors are different power connectors from one another;
   the first vehicle power connector is a 20-amp recreational vehicle power connector;
   the second vehicle power connector is a 30-amp recreational vehicle power connector; and
   the third vehicle power connector is a 50-amp recreational vehicle power connector.

21. A system, comprising:
   a first electrical power meter configured to selectively provide electrical power at a first current amount via a first vehicle power connector and provide electrical power at a second current amount via a second vehicle power connector, the first electrical power meter comprising:
   a first network interface;
   one or more electrical power inputs configured to receive electrical power from a power-distribution system of a vehicle facility configured to host a plurality of vehicles;
   a first electrically controlled switch configured to selectively conduct electrical power from the power-distribution system via the first vehicle power connector;
   a second electrically controlled switch configured to selectively conduct electrical power from the power-distribution system via the second vehicle power connector; and
   a first client-side processor coupled to the first network interface, the first electrically controlled switch, and the second electrically controlled switch, wherein the first client-side processor is configured to communicate via the first network interface with a remote server system; and
   the remote server system, comprising:
   one or more server-side processors; and
   memory storing instructions that when executed effectuate operations comprising:
   causing a user-computing device of a user to display a user interface by which power-delivery via the first electrical power meter is configurable;
   receiving, from the user-computing device, a request to deliver electrical power via the first vehicle power connector; and in response to receiving the request, transmitting, to the network interface of the first electrical power meter, a command that causes the client-side processor to adjust the first electrically controlled switch to effectuate delivery of electrical power at the first current amount via the first vehicle power connector, wherein:

the first electrical power meter comprises an electrically controlled water valve; and the first client-side processor is configured to cause the electrically controlled water valve to open or close responsive to commands from the remote server system to selectively provide water to a recreational vehicle.

\* \* \* \* \*